United States Patent
Bhattacharyya et al.

(10) Patent No.: US 9,076,867 B2
(45) Date of Patent: Jul. 7, 2015

(54) SEMICONDUCTOR DEVICE STRUCTURES INCLUDING STRAINED TRANSISTOR CHANNELS

(71) Applicant: Micron Technology, Inc., Boise, ID (US)

(72) Inventors: Arup Bhattacharyya, Essex Jct., VT (US); Leonard Forbes, Corvallis, OR (US); Paul A. Farrar, Okatie, SC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/188,186

(22) Filed: Feb. 24, 2014

(65) Prior Publication Data

US 2014/0167186 A1   Jun. 19, 2014

Related U.S. Application Data

(62) Division of application No. 13/611,249, filed on Sep. 12, 2012, now Pat. No. 8,679,928, which is a division of application No. 11/745,814, filed on May 8, 2007, now Pat. No. 8,293,611.

(51) Int. Cl.
| | |
|---|---|
| *H01L 29/78* | (2006.01) |
| *B82Y 10/00* | (2011.01) |
| *H01L 21/265* | (2006.01) |
| *H01L 21/8238* | (2006.01) |
| *H01L 29/66* | (2006.01) |

(52) U.S. Cl.
CPC ............. *H01L 29/7833* (2013.01); *B82Y 10/00* (2013.01); *H01L 21/26506* (2013.01); *H01L 21/823807* (2013.01); *H01L 21/823814* (2013.01); *H01L 29/66492* (2013.01); *H01L 29/6653* (2013.01); *H01L 29/6659* (2013.01); *H01L 29/66636* (2013.01); *H01L 29/7834* (2013.01); *H01L 29/7848* (2013.01)

(58) Field of Classification Search
CPC .................................................. H01L 29/7848
See application file for complete search history.

(56) References Cited

U.S. PATENT DOCUMENTS

| | | | |
|---|---|---|---|
| 6,255,698 | B1 | 7/2001 | Gardner et al. |
| 6,603,156 | B2 | 8/2003 | Rim |
| 6,767,802 | B1 | 7/2004 | Maa et al. |

(Continued)

OTHER PUBLICATIONS

"adjacent" Dictionary.com Unagridged, Random House, Inc. Feb. 28, 2011 <Dictionary.com, http://dictionary.reference.com/browse/adjacent>.

(Continued)

*Primary Examiner* — Evan Pert
(74) *Attorney, Agent, or Firm* — TraskBritt

(57) ABSTRACT

The present invention includes methods for stressing transistor channels of semiconductor device structures. Such methods include the formation of so-called near-surface "nanocavities" adjacent to the source/drain regions, forming extensions of the source/drain regions adjacent to and including the nanocavities, and implanting matter of a type that will expand or contract the volume of the nanocavities, depending respectively upon whether compressive strain is desirable in transistor channels between the nanocavities, as in PMOS field effect transistors, or tensile strain is wanted in transistor channels, as in NMOS field effect transistors, to enhance carrier mobility and transistor speed. Semiconductor device structures and semiconductor devices including these features are also disclosed.

20 Claims, 6 Drawing Sheets

(56) References Cited

U.S. PATENT DOCUMENTS

| | | | |
|---|---|---|---|
| 6,803,270 B2 | 10/2004 | Dokumachi et al. | |
| 6,828,214 B2 | 12/2004 | Notsu et al. | |
| 6,881,650 B2 | 4/2005 | Lee et al. | |
| 6,900,521 B2 | 5/2005 | Forbes | |
| 6,911,379 B2 | 6/2005 | Yeo et al. | |
| 6,940,089 B2 | 9/2005 | Cheng et al. | |
| 6,963,078 B2 | 11/2005 | Chu | |
| 6,967,121 B2 | 11/2005 | Rhodes | |
| 7,008,854 B2 | 3/2006 | Forbes | |
| 7,485,544 B2 | 2/2009 | Forbes et al. | |
| 7,691,714 B2 | 4/2010 | Rotondaro et al. | |
| 7,968,960 B2 | 6/2011 | Bhattacharyya et al. | |
| 8,222,113 B2 * | 7/2012 | Ting et al. | 438/300 |
| 8,293,611 B2 * | 10/2012 | Bhattacharyya et al. | 438/289 |
| 8,679,928 B2 * | 3/2014 | Bhattacharyya et al. | 438/289 |
| 8,772,097 B2 * | 7/2014 | Giles et al. | 438/197 |
| 2002/0074598 A1 | 6/2002 | Doyle et al. | |
| 2004/0173798 A1 | 9/2004 | Forbes | |
| 2004/0217352 A1 | 11/2004 | Forbes | |
| 2004/0217391 A1 | 11/2004 | Forbes | |
| 2004/0224480 A1 | 11/2004 | Forbes | |
| 2004/0232487 A1 | 11/2004 | Forbes | |
| 2005/0020094 A1 | 1/2005 | Forbes et al. | |
| 2005/0026403 A1 | 2/2005 | Lee et al. | |
| 2005/0029619 A1 | 2/2005 | Forbes | |
| 2005/0167752 A1 | 8/2005 | Forbes | |
| 2005/0212065 A1 | 9/2005 | Forbes | |
| 2005/0227463 A1 | 10/2005 | Ito et al. | |
| 2005/0247972 A1 | 11/2005 | Forbes | |
| 2006/0081896 A1 | 4/2006 | Maeda | |
| 2006/0163651 A1 | 7/2006 | Rotondaro et al. | |
| 2007/0096193 A1 | 5/2007 | Forbes et al. | |
| 2007/0238320 A1 | 10/2007 | Bhattacharyya et al. | |
| 2008/0029832 A1 | 2/2008 | Forbes | |
| 2008/0277734 A1 | 11/2008 | Bhattacharyya et al. | |
| 2013/0001575 A1 | 1/2013 | Bhattacharyya et al. | |

OTHER PUBLICATIONS

Aberg et al., Electron and Hole Mobility Enhancements in Sub-10nm-thick Strained Silicon Directly on Insulator Fabricated by a Bond and Etch-back Technique, Cambridge, MA, Symposium on VLSI Technology Digest of Technical Papers, pp. 52-53, 2004.

Aberg et al., High Electron and Hole Mobility Enhancements in Thin-Body Strained Si/Strained SiGe/Strained Si Heterostructures on Insulator, Cambridge, MA, IEEE, 4 pages, 2004.

Ang et al., Enhanced Performance in 50nm N-MOSFETs with Silicon-Carbon Source/Drain Regions, National University of Singapore, Singapore, IEEE, 3 pages, 2004.

Cai et al., Performance Comparison and Channel Length Scaling of Strained Si FETs on SiGe-on-Insulator (SGOI), Hopewell Junction, New York, IEEE, 4 pages, 2004.

Cheng et al., Fully Depleted Strained-SOI n- and p-MOSFETs on Bonded SGOI Substrates and Study of the SIGE/BOX Interface, IEEE Electron Device letters, vol. 25, No. 3, Mar. 2003, pp. 14-149.

Chleirigh et al., Mobility and Sub-threshold Characteristics in High-Mobility Dual-Channel Strained Si/Strained SiGe p-MOSFETs, Cambridge, MA, IEEE, pp. 203-204, 2005.

Ghani et al., A 90nm High Volume Manufacturing Logic Technology Featuring Novel 45nm Gate Length Strained Silicon CMOS Transistors, Hillsboro, OR, IEDM, vol. 3, pp. 978-980, 2003.

Goto et al., Technology Booster Using Strained-Enhancing Laminated SiN (SELS) for 65nm HP MPUs, Tokyo, Japan, IEEE, 4 pages, 2004.

Irie et al., In-Plane mobility Anisotropy and Universality Under Uniaxial Strains in n- and p-MOS Inversion Layers on (100), (110), and (111) Si, Tokyo, Japan, IEDM Tech. Dig, pp. 225-228, Dec. 2004.

Kawasaki et al., Impact of Parasitic Resistance and Silicon Layer Thickness Scaling for Strained-Silicon MOSFETs on Relaxed Si1-xGe1 Virtual Substrate, Yokohama, Tokyo, IEEE, 4 pages, 2004.

Komoda et al., Mobility Improvement for 45nm Node by Combination of Optimized Stress Control and Channel Orientation Design, Yokohama, Japan, IEEE, 4 pages, 2004.

Maikap et al., Package-Strain-Enhanced Device and Circuit Performance, Chung-Li, Taiwan, IEEE 4 pages, 2004.

Myerson et al., SiGe-Channel Heterojunction P-MOSFET's, IEEE Trans. Electron Devices, vol. 41, No. 1, pp. 90-101, Jan. 1994.

Nayak et al., High Performance GeSi Quantum-Well PMOS on SIMOX, Digest. Int. Electron Devices Meeting, San Francisco, pp. 777-780, Dec. 1992.

Nisoenzok et al., Helium Implant Depth Dependence on Thermal Growth of Nanocavities in Silicon, Solid-State and Integrated Circuits Technology, 2004, Proceedings. 7ty International Conference on, vol. 3, 18-21, pp. 2382-2386, Oct. 2004.

Numata et al., Performance Enhancement of Partially- and Fully-Depleted Strained-SOI MOSFETs and Characterization of Strained-Si Device Parameters, Kawasaki, Japan, IEEE, 4 pages, 2004.

People et al., Calculation of the Critical Layer Thickness Versus Lattice Mismatch for GexSi_x/Si Strained-Layer Heterostructures, Appl. Phys. Lett, pp. 322-324, Aug. 1985.

Pidin et al., A Novel Strain Enhanced CMOS Architecture Using Selectively Deposited High Tensile and High Compressive Silicon Nitride Films, Tokyo, Japan, IEEE, 4 pages, 2004.

Rangan et al., Formation and Characterization of Multi-Layered Nanocavities in Silicon with Cascade Helium Implantation/Anneal, Solid-State and Integrated-Circuit Technology, 2001, Proceedings, 6th International Conference on, vol. 2, 22-25, pp. 1360-1365, Oct. 2001.

Rangan et al., Helim-Induced Nanocavities in Silicon: Formation and Properties, Conference of Physics of Semiconductor Devices, vol. 1 pp. 255-261, Dec. 11-15, 2001.

Saggio et al, Innovative Localized Lifetime Control in High-Speed IGBT's, Electron Device Letters, IEEE, vol. 18, issue 7, pp. 333-335, Jul. 1997.

Subhanna et al., High-Performance Silicon-Germanium Technology, Hopewell Junction, New York, IEEE, pp. 195-196, 2005.

Thompson et al., Key Differences for Process-induced Uniaxial vs. Substrate-induced Biaxial Stressed Si and Ge Channel MOSFETs, Gainesville, Florida, IEEE, 4 pages, 2004.

Uchida et al., Experimental Study of Biaxial and Uniaxial Strain Effects on Carrier Mobility in Bulk and Ultrathin-body SOI MOSFETs, Stanford University, CA, IEEE, 4 pages, 2004.

Yin et al., Fully-Depleted Strained-Si on Insulator NMOSFETs without Relaxed SiGe Buffers, Princeton, NJ, IEDM, vol. 3, pp. 53-56, 2003.

Yuan et al, Fabrication and Transistor Demonstration on Si-based nanomembranes, Madison, Wisconsin, NSTI-Nanotech vol. 1, pp. 68-71, 2006.

* cited by examiner

SEMICONDUCTOR DEVICE STRUCTURES INCLUDING STRAINED TRANSISTOR CHANNELS

CROSS-REFERENCE TO RELATED APPLICATIONS

This application is a divisional of U.S. patent application Ser. No. 13/611,249, filed Sep. 12, 2012, now U.S. Pat. No. 8,679,928, issued Mar. 25, 2014, which is a divisional of U.S. patent application Ser. No. 11/745,814, filed May 8, 2007, now U.S. Pat. No. 8,293,611, issued Oct. 23, 2012, the disclosure of each of which is hereby incorporated herein in its entirety by this reference.

FIELD OF THE INVENTION

The present invention relates generally to methods for straining transistor channels of semiconductor device structures to improve device performance. More specifically, the present invention relates to methods in which impurities and thermal processing are applied to strain the transistor channels. The present invention also relates to methods for fabricating semiconductor devices and to semiconductor devices.

BACKGROUND OF RELATED ART

Improvements in hole mobility have been recognized in PMOS devices (i.e., metal-oxide-semiconductor (MOS) devices with n-type, or n-doped, substrates and p-type charge, or hole, carriers), or transistors, by compressively straining the channels of such devices. Similar improvements in electron mobility have been realized in NMOS devices (i.e., MOS devices with p-type, or p-doped, substrates and n-type charge, or electron, carriers), or transistors, when the channels thereof experience tensile strain. Enhanced carrier mobility may be used as a means to improve transistor speed and performance.

A number of techniques have been researched to compressively stress PMOS regions, including the inclusion of a strained layer of silicon-germanium (SiGe) within the source/drain regions to compressively stress the channel region between the source and drain, which results in an increase in hole mobility of up to 50%. Strained silicon layers have also been fabricated on relaxed silicon-germanium layers in the channel regions of NMOS devices to create uniaxial tensile stress in the channel region between the source and drain to enhance electron mobility and increase the speed of NMOS transistors.

When silicon-germanium is used, a layer of silicon-germanium is formed, typically by ultra-high vacuum chemical vapor deposition (CVD) techniques. The layer of silicon-germanium is then capped with a thinner silicon film. Lattice mismatches between the relaxed silicon-germanium layer and the silicon capping layer generate the desired tensile stress. Unfortunately, the ultra-high vacuum CVD techniques that have been used to fabricate silicon-germanium layers are extremely expensive and, thus, less conducive to use in large-scale semiconductor device fabrication processes.

A number of other experimental techniques for stressing channel regions of semiconductor device structures have also been developed. Tensile strain has been generated in the channels of NMOS devices by using silicon carbide (SiC) in the source/drain regions. Semiconductor device structures have also been bent (which may, e.g., be effected in packaging and encapsulation) to stress the transistor channels. In addition, semiconductor device structures have been fabricated with stress-inducing silicon nitride capping layers.

It would be desirable to develop a process by which transistor channels of semiconductor device structures may be stressed economically and on a scale that is suitable for incorporation into semiconductor device fabrication.

BRIEF DESCRIPTION OF THE DRAWINGS

In the drawings, in which various features of embodiments of the present invention are depicted.

DETAILED DESCRIPTION

The present invention includes methods for straining the semiconductor channels of transistors. Such methods include the formation of so-called near-surface "nanocavities" adjacent to the source/drain regions of a transistor, and implanting and embedding elements within the nanocavities of a type that will expand or contract (i.e., strain) the volumes of the nanocavities, depending respectively upon whether a resulting compressive strain in the transistor channel between the nanocavities is desirable, as in PMOS transistors (e.g., PMOS field effect transistors, or PFETs), or a resulting tensile strain is wanted, as in NMOS transistors (e.g., NMOS field effect transistors, or NFETs), to enhance carrier mobility and transistor speed.

Figure 1:
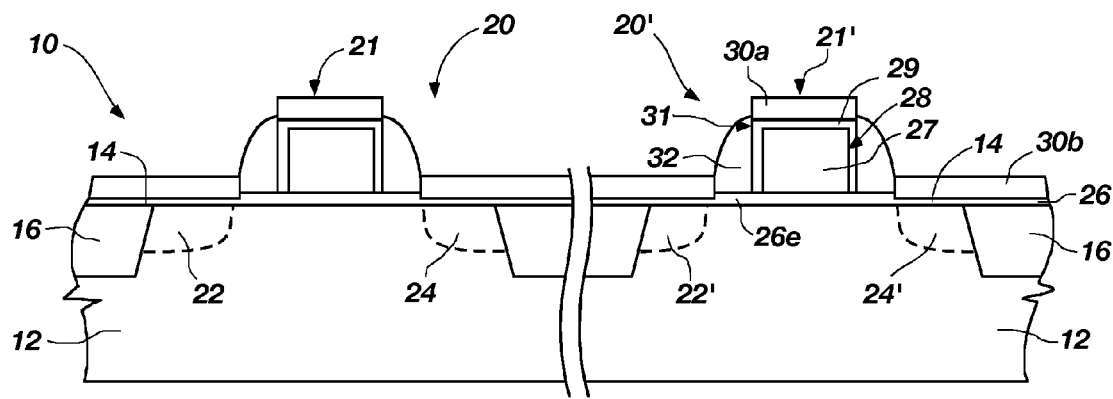
FIG. 1 depicts an embodiment of an intermediate semiconductor device structure in which strained transistor channels may be formed.

With reference to FIG. 1, an embodiment of an intermediate semiconductor device structure 10 that includes a plurality of transistors 20, 20' is shown. Transistors 20 and 20' are formed adjacent to a surface 14 of a semiconductor substrate 12. The term "semiconductor substrate," as used in herein, includes, without limitation, full or partial wafers of semiconductive material (e.g., silicon, gallium arsenide, indium phosphide, etc.), semiconductor-on-insulator (SOI) type substrates (e.g. silicon-on-ceramic (SOC), silicon-on-glass (SOG), silicon-on-sapphire (SOS), etc.), and any other suitable fabrication substrates. In the illustrated embodiment, which should not be considered to limit the scope of the present invention, each transistor is disposed between a pair of isolation structures 16, which may comprise dielectric regions, such as the various configurations of shallow trench isolation (STI) structures known in the art.

Each transistor 20, 20' may include spaced-apart source 22, 22' and drain 24, 24' regions formed in semiconductor substrate 12 at surface 14. A gate region insulator layer 26 is disposed on surface 14 and is positioned laterally between source 22, 22' and drain 24, 24'. One or more conductive layers are located on gate region insulator layer 26 and form a conductive element 27 of the gate 21, 21' of transistor 20, 20'. An oxide film 28 (e.g., a silicon dioxide film formed by thermal oxidation, low temperature oxidation, or other suitable process, etc.) coats the top and side walls of conductive element 27 and forms a portion 29 of a gate cap 31 on conductive element 27.

A silicon nitride film is formed over oxide film 28. The silicon nitride film is then patterned, as known in the art to form a "hard" mask. Silicon nitride is removed from side walls of each gate 21, 21' and from locations over surface 14 that are immediately laterally adjacent to the side walls of each gate 21, 21'. The results of such patterning are a nitride cap 30a, which comprises another part of gate cap 31, over each gate 21, 21' and a nitride mask 30b, which resides on portions of gate region insulator layer 26 that overlie isolation structures 16 and locations where source/drain regions 22, 22', 24, 24' are to be formed. Regions 26e of gate region insulator layer 26 that are located laterally adjacent to each gate 21, 21' are not covered by nitride mask 30b.

Disposable side wall spacers 32, which have been fabricated by known processes (e.g., blanket deposition of a suitable material, such as polysilicon, and use of a spacer etch), are located adjacent to the side walls of each gate 21, 21'. Notably, each disposable side wall spacer 32 is formed directly on a region 26e of gate region insulator layer 26. The material from which disposable side wall spacers 32 are formed may be removable with selectivity over, or at a faster rate than, the material of nitride cap 30a and nitride mask 30b.

In the depicted embodiment, transistor 20 is an NFET, or a transistor that includes source/drain regions 22, 24 that are doped with n-type, or negative charge carrier or electron-donating, dopants, or impurities (e.g., phosphorus (P), arsenic (As), antimony (Sb), etc.). Transistor 20' is a PFET, which includes source/drain regions 22', 24' that are doped with p-type, or positive charge carrier or hole-generating, dopants, or impurities (e.g., boron (B), aluminum (Al), etc.). Ion implantations of appropriate impurities for source/drain regions 22, 24 (n+ for NFET) and source/drain regions 22', 24' (p+ for PFET) are successively carried out using appropriate photomasks for PFET and NFET regions, respectively, as practiced in standard CMOS fabrication processes.

The illustrated features of semiconductor device structure 10 and of transistors 20 and 20' thereof may be fabricated by any suitable, known processes.

An embodiment of a method for straining source/drain regions 22, 22' and 24, 24' of transistors 20 and 20' and, consequently, the channel regions of transistors 20 and 20', is shown in FIGS. 2 through 10.

Figure 2:
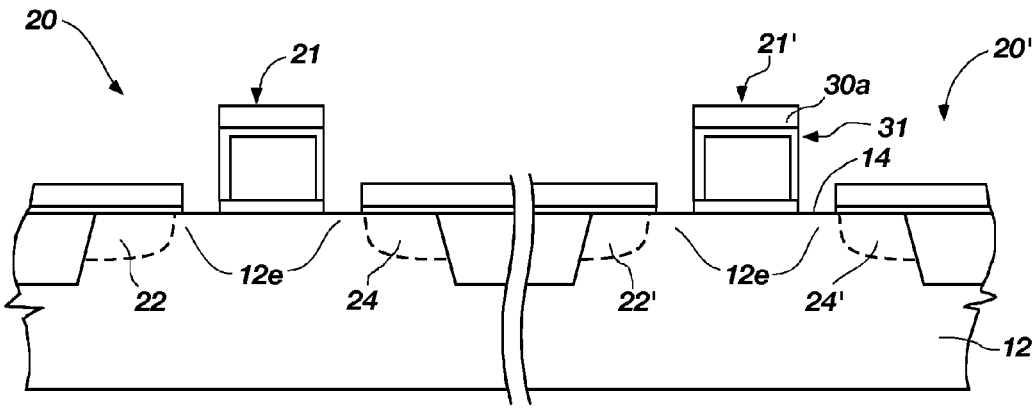
FIGS. 2-10 illustrate an embodiment of a method for straining transistor channels of a semiconductor device structure.

As shown in FIG. 2, disposable side wall spacers 32 are removed from transistors 20, 20'. Disposable side wall spacers 32 (see FIG. 1) may be selectively removed by any suitable process, such as with an etchant that removes the material of side wall spacers 32 with selectivity over nitride cap 30a and oxide film 28 portion 29 of gate cap 31. Once disposable side wall spacers 32 are removed, regions 26e (see FIG. 1) of gate region insulator layer 26 previously shielded by disposable side wall spacers 32 are exposed and may be removed. Such removal may be effected as part of the same process as the removal of disposable side wall spacers 32, or as part of a subsequent process. Removal of portions of gate region insulator layer 26 results in the exposure of surface 14 of semiconductor substrate 12 at locations 12e that are laterally adjacent to source/drain regions 22, 22' and 24, 24' at locations that are laterally adjacent to gate 21, 21'.

Figure 3:
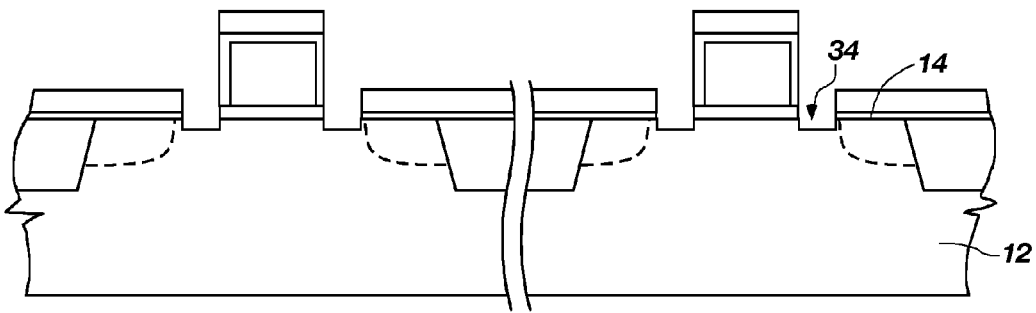

As shown in FIG. 3, a thin region of substrate material is removed from semiconductor substrate 12 at locations 12e (see FIG. 2) where surface 14 is exposed. Such material removal, which forms nano-trenches 34 in semiconductor substrate 12, may be effected in a controlled manner to a predetermined depth (e.g., to a depth of 200 Å or thereabout). Without limiting the scope of the present invention, material may be removed from semiconductor substrate 12 by a controlled etch process.

Figure 4:
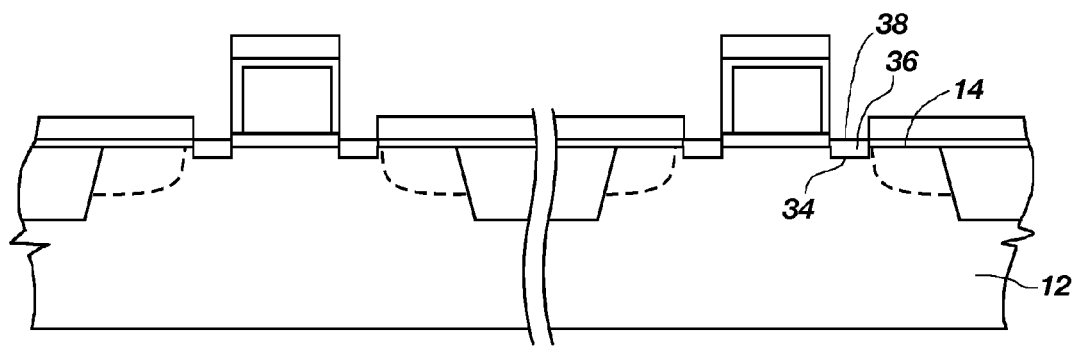

An amorphous semiconductor material 36 (e.g., amorphous silicon) may then be introduced into nano-trenches 34 and, thus, into contact with the exposed portions of semiconductor substrate 12, as shown in FIG. 4. The newly introduced amorphous semiconductor material 36 may protrude beyond a plane in which surface 14 is located; thus, a thickness of amorphous semiconductor material 36 may exceed the depth to which material was removed from semiconductor substrate 12 (e.g., 200 Å or thereabout). Any suitable process may be used to introduce amorphous semiconductor material 36 into nano-trenches 34. In some embodiments, a suitable deposition process (e.g., chemical vapor deposition (CVD), atomic layer deposition (ALD), etc.) may be used to form an amorphous semiconductor film (not shown). When a blanket deposition process is used, any portions of the amorphous semiconductor film that overlie nitride cap 30a and/or nitride mask 30b may, of course, be removed by a suitable process; for example, with a wet etchant.

Figure 5:
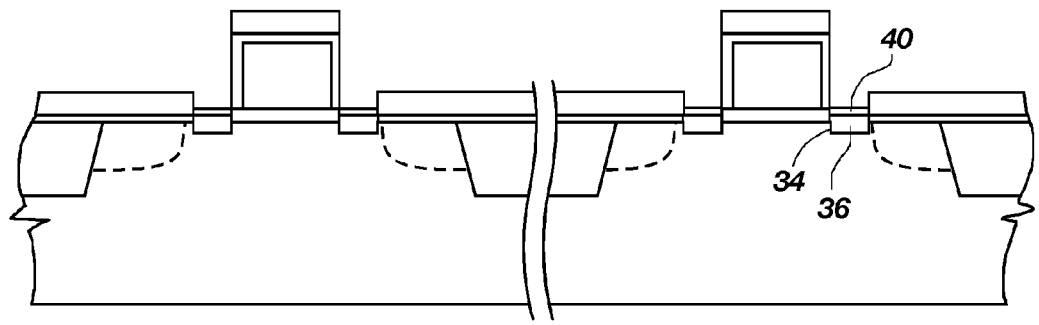

As shown in FIG. 5, a surface 38 (see FIG. 4) of amorphous semiconductor material 36 may be oxidized to form an oxide film 40 (e.g., a silicon dioxide film) on each quantity of amorphous semiconductor material 36 residing primarily within a nano-trench 34. Any suitable oxidation process, including, but not limited to, a low temperature oxidation technique, may be employed. The resulting oxide film 40 may have a thickness of about 50 Å to about 100 Å.

Figure 6:
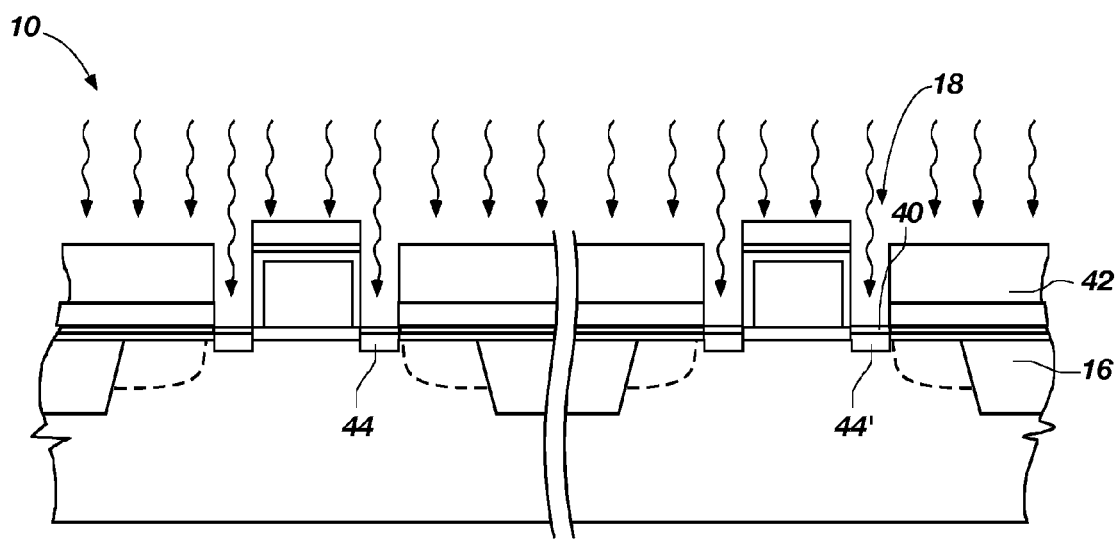

After an oxide film 40 has been formed on each quantity of amorphous semiconductor material 36 (see FIG. 5), as FIG. 6 depicts, a mask 42 of known, suitable type (e.g., a photomask, etc.) may be formed so as to shield and prevent implantation of helium (He) into regions of semiconductor device structure 10 where implantation is not desired. As depicted, source/drain regions 18, which are confined between isolation structures 16, are exposed through mask 42.

With mask 42 in place, a shallow helium (He) ion implantation process may be conducted. By way of example and not by way of limitation, He ion implantation may be effected by known processes at a dose of at least about $3 \times 10^{20}$ ions per $cm^3$, which facilitates the confinement and distribution of subsequently implanted ions to within a depth of about 200 Å of surface 14.

Semiconductor device structure 10 is then subjected to rapid thermal processing (RTP), or a rapid thermal anneal (RTA), of a known type (see, e.g., Rangan, S., et al., "Formation and characterization of multi-layered nanocavities in silicon with cascade helium implantation/anneal," Proceedings, $6^{th}$ Int'l Conf. on Solid State and Integrated-Circuit Technology, 2:1360-1363 (2001); Ntsoenzok, E., et al., "Helium implant depth dependence on thermal growth of nanocavities in silicon," Proceedings, $7^{th}$ Int'l Conf. on Solid State and Integrated-Circuit Technology, 3:2382-2386 (2002), the disclosures of both of which are hereby incorporated herein, in their entireties, by this reference) to form nanocavities 44, 44' from amorphous semiconductor material 36 that remains within nano-trenches 34.

Figure 7:
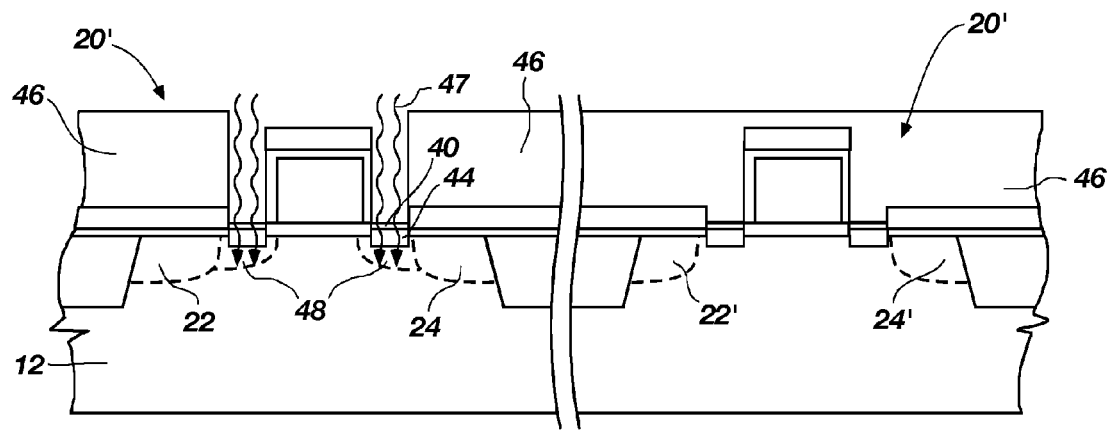

FIG. 7 shows the formation of n− source/drain extensions 48 (i.e., lateral extensions of source/drain regions 22, 24, which may be considered to form a part of their corresponding active-device region) in each NFET 20 while each PFET 20' is shielded from such processing (e.g., by way of a mask 46, such as a photomask or the like, as illustrated). N-type impurities 47 are implanted into semiconductor substrate 12 through oxide film 40 and each nanocavity 44 by known processes.

Figure 8:
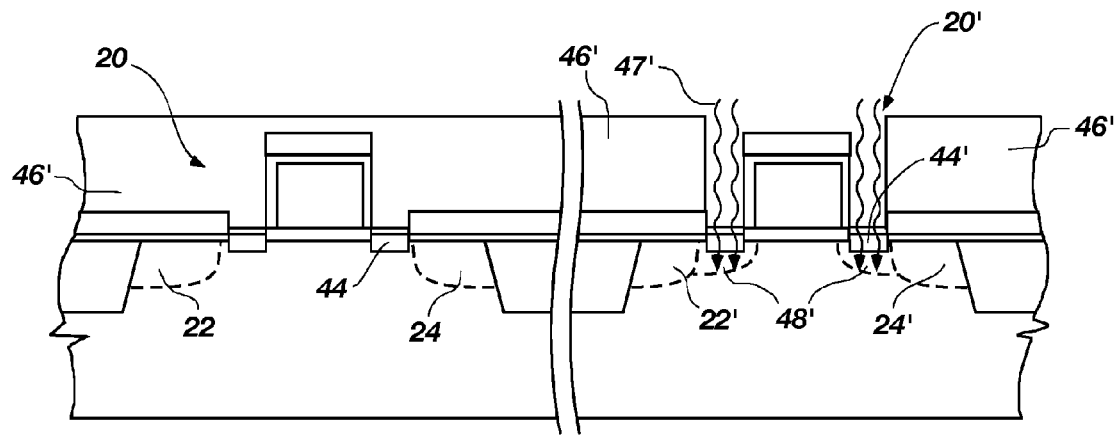

As FIG. 8 illustrates, equivalent processes may be used to form p− source/drain extensions 48' (i.e., lateral extensions of source/drain regions 22', 24', which may be considered to form a part of their corresponding active-device region) in each PFET 20' as each NFET 20, or at least the nanocavities 44 thereof, is shielded (e.g., by mask 46', as illustrated). Again, an implantation process is employed with parameters that implant p-type impurities 47' to a location that exceeds the depth of each nanocavity 44'.

The implantation processes for the stress inducing elements and for the impurities are controlled in such a way that the impurities are implanted more deeply into amorphous semiconductor material 36 than the stress inducing elements. For example, implantation of the stress inducing elements may be confined to a peak depth of about 100 Å into amorphous semiconductor material 36 and to a distribution of about 100 Å from each peak. By establishing impurity profiles that are deeper than the profiles of the implanted stress inducing elements and the resulting strained portions of source/drain regions 22, 22', 24, 24', low leakage junction characteristics of the source/drain regions 22, 22', 24, 24' may be preserved.

Once source/drain extensions 48 (see FIG. 7) and 48' (see FIG. 8) have been formed, semiconductor device structure 10 may optionally be subjected to rapid thermal processing, the parameters (e.g., temperature, duration, etc.) of which facilitate at least partial activation of the implanted impurities. In some embodiments, an RTA at a temperature of up to about 900° C. could be carried out for about one second to about ten seconds to achieve partial activation of the implanted impurities.

Stress inducing elements are now selectively implanted in regions 48, 22, 24 and 48', 22', 24' for each type of device (i.e., NFET 20 and PFET 20', respectively). Sidewall spacers may then be fabricated by known processes (e.g., by depositing a suitable material, such as a silicon nitride, silicon oxide, silicon oxynitride or the like, use of spacer etch techniques, etc.).

Figure 9:
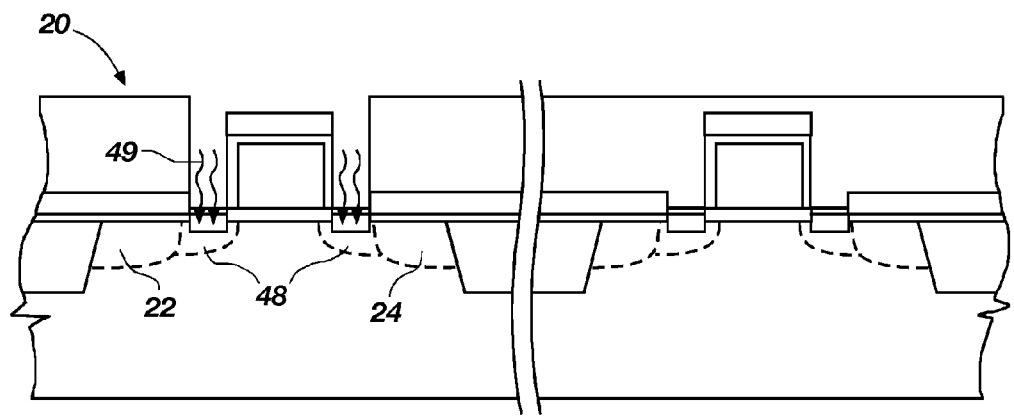

In addition to implanting impurities into source/drain extensions 48 and 48', stress inducing elements 49 (see FIG. 9), 49' (see FIG. 10) may also be implanted into source/drain extensions 48 and 48', as well as into source/drain regions 22, 22', 24, 24'. In this regard, hydrogen species or a mixture of hydrogen molecules ($H_2$) and argon (Ar) may be implanted into source/drain extensions 48 and, optionally, into source/drain regions 22, 24 of each NFET 20, as shown in FIG. 9. Such "hydrogen implantation" may be effected as known in the art, such as at a dose of at least about $3 \times 10^{20}$ molecules per $cm^3$ for each implanted species (e.g., hydrogen, argon, both hydrogen and argon, etc.), and limited to a depth that is within about 150 Å from surface 14.

Figure 10:
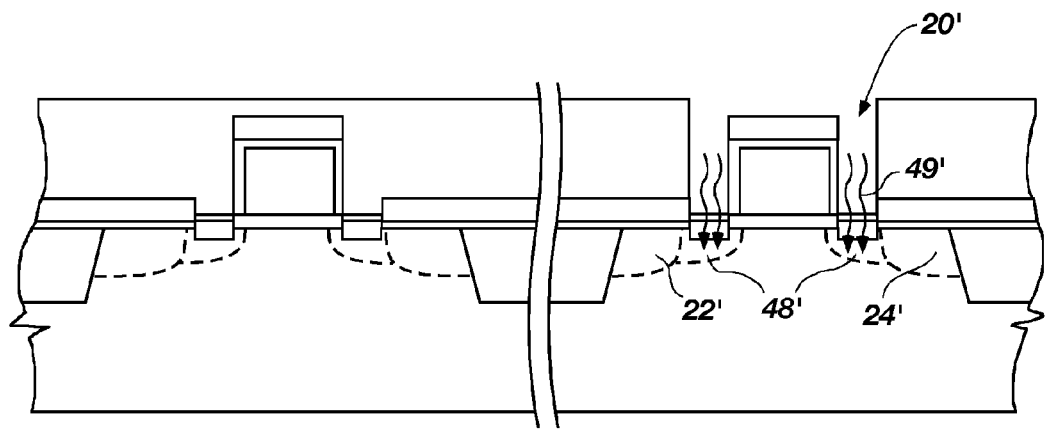

Similarly, as illustrated in FIG. 10, oxygen species may be implanted into source/drain extensions 48' and, optionally, into source/drain regions 22', 24' of each PFET 20', as shown in FIG. 10. Without limiting the scope of the present invention, oxygen implantation may be effected as known in the art, at a dose of at least about $3 \times 10^{20}$ molecules per $cm^3$ and limited to a depth that is within about 150 Å from surface 14.

Rapid thermal processing of appropriate parameters (e.g., temperature, duration, etc.) may then be conducted to establish the desired profiles for source/drain regions 22, 22', 24, 24', as known in the art, as well as establish the desired profiles for source/drain extensions 48 and 48' of source/drain regions 22, 22', 24, 24'. Additionally, the RTP induces uniaxial tensile stress (in the direction in which charge carriers (i.e., holes) flow) in the channel of each NFET 20 (see FIG. 9), in the form of recrystallization of amorphous silicon in source/drain regions 22, 24 and/or extensions 48 thereof at or near surface 14, which decreases, or shrinks, the volume of each recrystallized area. In addition, the RTP generates compressive stress in the channel (i.e., the semiconductor material between source/drain regions 22' and 24') of each PFET 20' (see FIG. 10), in the form preferential oxidation of source/drain regions 22', 24' and/or extensions 48' thereof at helium-induced bubbles at or near surface 14, which increases, or expands, the volume of each preferentially oxidized region. The results of such stress are, respectively, uniaxial tensile strain in the transistor channel between the volume-contracted, or shrunk, source/drain regions 22, 24 or extensions 48 thereof in each NFET 20 and compressive strain in the transistor channel between the volume-expanded source/drain regions 22', 24' or extensions 48' thereof of each PFET 20'.

Figure 11:
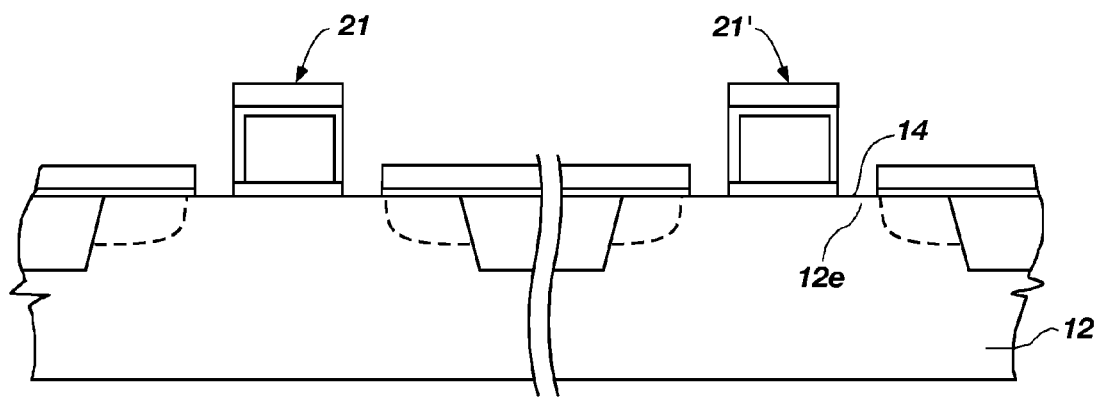
FIGS. 11-16 show another process for straining transistor channels of a semiconductor device structure in accordance with another embodiment of the present invention.

Another embodiment of a method of the present invention is illustrated in FIGS. 11 through 16. After implanting impurities into source/drain regions 122, 124, disposable side wall spacers 32 (see FIG. 1) and underlying regions 26e of gate region insulator layer 26 (see FIG. 1) are removed to expose locations 12e of semiconductor substrate 12 that are laterally adjacent to the side walls of gates 21, 21', as illustrated in FIG. 11.

Figure 12:
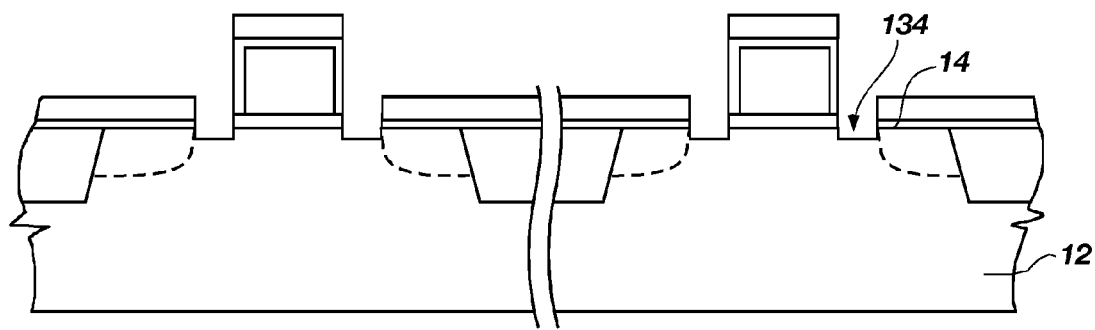

As shown in FIG. 12, material is removed from semiconductor substrate 12 at locations 12e (see FIG. 11) where surface 14 is exposed. Such material removal, which forms nano-trenches 134 in semiconductor substrate 12, may be effected in a controlled manner to a predetermined depth (e.g., to a depth of 500 Å or thereabout). Without limiting the scope of the present invention, material may be removed from semiconductor substrate 12 by a controlled etch process.

Figure 13:
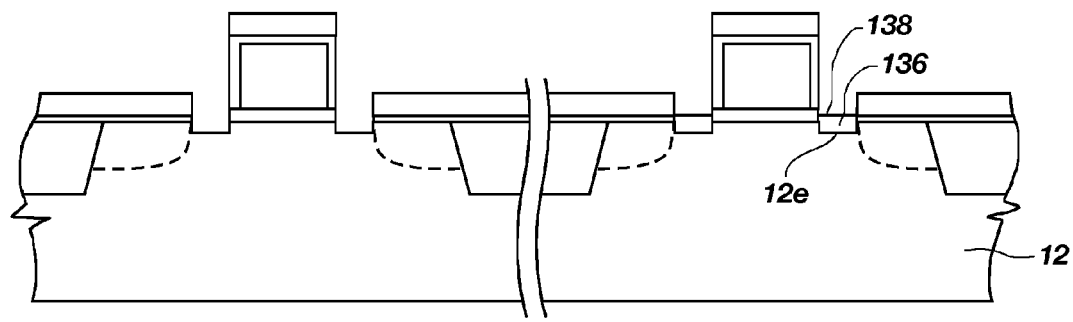

Turning to FIG. 13, known epitaxial processes may then be used to form a film 136 of semiconductor material (e.g., crystalline silicon, etc.) on each exposed location 12e of semiconductor substrate 12. Each semiconductor film 136 may have a thickness of about 1,000 Å or less.

Figure 14:
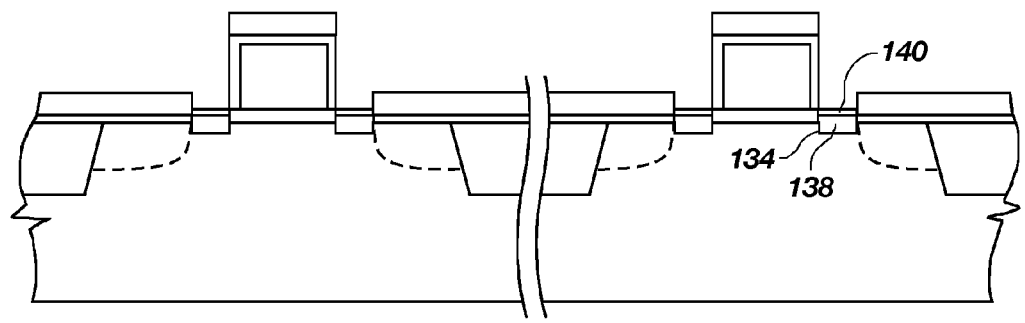

As shown in FIG. 14, a surface 138 (see FIG. 13) of each semiconductor film 136 may be oxidized to form an oxide film 140 (e.g., a silicon dioxide film) on each semiconductor film 136 residing primarily within a nano-trench 134. Any suitable oxidation process, including, but not limited to, a low temperature oxidation technique, may be employed. The resulting oxide film 140 may have a thickness of about 50 Å to about 100 Å.

Figure 15:
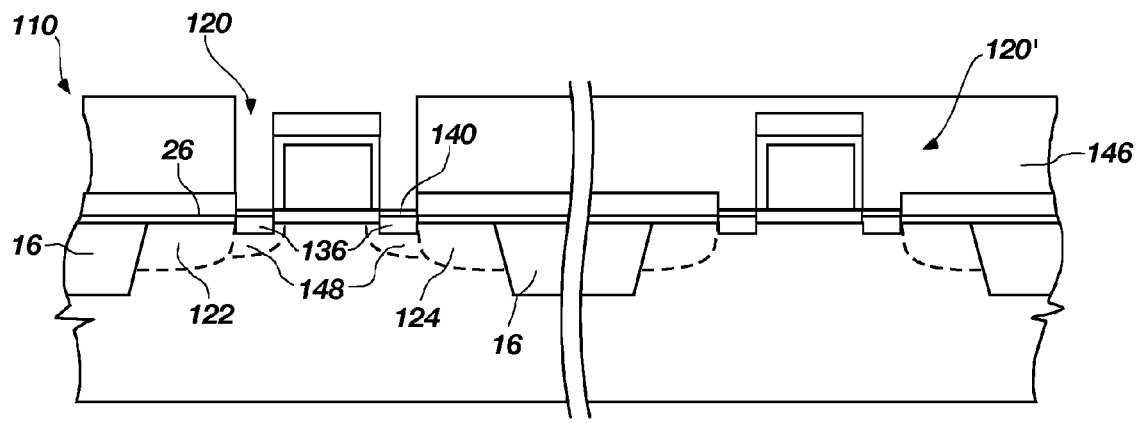

FIG. 15 shows the formation of n− source/drain extensions 148 (i.e., lateral extensions of source/drain regions 122, 124, which may be considered to form a part of their corresponding active-device region) in each NFET 120 while each PFET 120', isolation structures 16, and any other regions of semiconductor device 110 where implantation is not desired are shielded from such processing (e.g., by way of a mask 146, such as a photomask or the like, as illustrated). Stress inducing elements (e.g., argon and hydrogen molecules) (not shown) are implanted into source/drain regions 122, 124 and semiconductor film 136 through gate region insulator layer 26 and oxide film 140. Such implantation is effected at a dose of at least about $3 \times 10^{20}$ molecules per $cm^3$.

Figure 16:
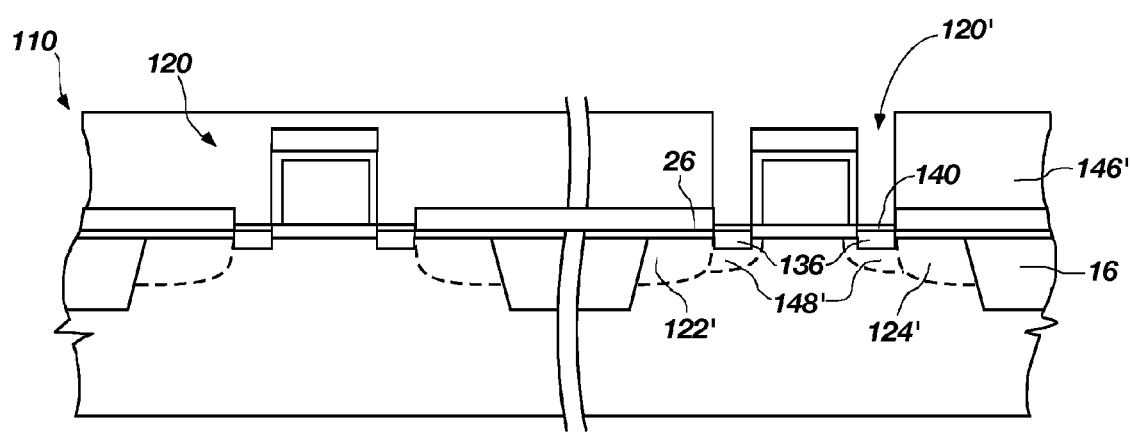

As FIG. 16 illustrates, equivalent processes may be used to form p− source/drain extensions 148' (i.e., lateral extensions of source/drain regions 122', 124', which may be considered to form a part of their corresponding active-device region) in each PFET 120' as each NFET 120, or at least each semiconductor film 136 thereof, isolation structures 16, and other regions of semiconductor device 110 where implantation is not desired are shielded (e.g., by mask 146', as illustrated). Stress inducing elements and p-type impurities (not shown) are implanted into source/drain regions 122', 124' and semiconductor films 136 through gate region insulator layer 26 and oxide film 140, respectively. Such implantation for stress inducement is effected at a dose of at least about $3 \times 10^{20}$ molecules per $cm^3$ for each type of element implanted.

The implantation processes for the stress inducing elements and for the impurities are controlled in such a way that the impurities are implanted more deeply into each semiconductor film 136 than the stress inducing elements. In some embodiments of a method of the present invention, implantation of the stress inducing elements may be confined to a peak depth of about 100 Å into each semiconductor film 136 and to a lateral distribution of about 100 Å from each peak. By establishing impurity profiles that are deeper than the profiles of the implanted stress inducing elements and the resulting strained portions of source/drain regions 122, 122', 124, 124', low leakage junction characteristics of the source/drain regions 122, 122', 124, 124' may be preserved.

Once source/drain extensions 148 and 148' have been formed, semiconductor device structure 110 may be subjected to rapid thermal processing, the parameters (e.g., temperature, duration, etc.) of which facilitate local oxidation/recrystallization of silicon (LOCOS) and at least partial activation of the implanted impurities, as well as form nanocavities (not shown) from semiconductor films 136 and establish the desired profiles for source/drain regions 122, 122', 124, 124' and their extensions 148 and 148'. Such rapid thermal processing may be effected by known RTA processes. In some embodiments, the RTA may be conducted at a temperature of about 1,000° C. for about one second to about ten seconds.

Additionally, the RTP induces tensile stress in each NFET 120, which occurs due to recrystallization and/or formation of epitaxial silicon in source/drain regions 122, 124 and/or extensions 148 thereof at or near surface 14. The recrystallization and/or formation of epitaxial silicon decreases, or shrinks, the volume of each recrystallized area, which, in turn, applies tensile stress to material between each pair of recrystallized and/or epitaxially formed regions. In addition, the RTP generates compressive stress in the channel of each PFET 120', in the form preferential oxidation of source/drain regions 122', 124' and/or extensions 148' thereof at helium-induced bubbles at or near surface 14. Oxidation increases, or expands, the volume of each preferentially oxidized region and compresses material between the preferentially oxidized regions, which, in turn, applies compressive stress to material between each pair of oxidized regions. The results of such stress are, respectively, tensile strain in the transistor channels between source/drain regions 122, 124 or extensions 148 thereof in each NFET 120 and compressive strain in the transistor channels between source/drain regions 122', 124' or extensions 148' thereof of each PFET 120.

Once process flow according to embodiments of the present invention has occurred, further processing of semiconductor device structures 10, 110 may be effected, as known in the art, to fabricate complete semiconductor devices.

Embodiments of semiconductor device structures and semiconductor devices according to the present invention include features such as the source/drain regions 22, 22', 24, 24', nanocavities 44, 44', and source/drain extensions 48, 48', 148, 148' shown in FIGS. 10 and 16.

Although the foregoing description contains many specifics, these should not be construed as limiting the scope of the present invention, but merely as providing illustrations of some of the presently preferred embodiments. Similarly, other embodiments may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed:

1. A semiconductor device structure, comprising:
at least one transistor comprising:
a source and a drain in a substrate on opposing sides of a transistor gate, a strained transistor channel positioned between the source and the drain;
opposing regions of a semiconductor material each comprising a plurality of nanocavities, a first of the opposing regions of the semiconductor material located between the strained transistor channel and the source, and a second of the opposing regions of the semiconductor material located between the strained transistor channel and the drain;
a source extension at least partially underlying the first of the opposing regions of the semiconductor material and located between the strained transistor channel and the source; and
a drain extension at least partially underlying the second of the opposing regions of the semiconductor material and located between the strained transistor channel and the drain.

2. The semiconductor device structure of claim 1, wherein each of the opposing regions of the semiconductor material has a base located about 500 Å beneath a surface of the substrate and a thickness of less than or equal to about 1,000 Å.

3. The semiconductor device structure of claim 1, wherein at least one of the source, the drain, the source extension, and the drain extension comprises an implanted oxygen species.

4. The semiconductor device structure of claim 1, wherein at least one of the source, the drain, the source extension, and the drain extension comprises a crystallized semiconductor material or a recrystallized semiconductor material.

5. The semiconductor device structure of claim 1, wherein at least one of the source, the drain, the source extension, and the drain extension comprises at least one of implanted hydrogen and implanted argon.

6. The semiconductor device structure of claim 1, wherein the nanocavities extend to a depth of less than or equal to about 200 Å below a surface of the substrate.

7. The semiconductor device structure of claim 1, further comprising stress inducing elements in the source extension and the drain extension.

8. The semiconductor device structure of claim 7, wherein the stress inducing elements extend to a depth of less than or equal to about 150 Å below a surface of the substrate.

9. The semiconductor device structure of claim 1, further comprising an oxide film on upper surfaces of the opposing regions of the semiconductor material.

10. The semiconductor device structure of claim 1, wherein the strained transistor channel exhibits compressive strain.

11. The semiconductor device structure of claim 1, wherein the strained transistor channel exhibits tensile strain.

12. A semiconductor device structure, comprising:
a transistor gate over a surface of a substrate;
a source and a drain in regions of the substrate laterally outward from opposing sides of the transistor gate, a strained transistor channel between the source and the drain;
nanocavities in opposing regions of a semiconductor material within the substrate and adjacent the opposing sides of the transistor gate;

a source extension laterally between the strained transistor channel and the source, the source extension comprising conductivity dopants and stress inducing elements; and a drain extension laterally between the strained transistor channel and the drain, the drain extension comprising the conductivity dopants and the stress inducing elements.

13. The semiconductor device structure of claim 12, wherein the source extension and the drain extension at least partially underlie the opposing regions of the semiconductor material.

14. The semiconductor device structure of claim 12, wherein the stress inducing elements comprise an oxygen species, or at least one of a hydrogen species and argon species.

15. The semiconductor device structure of claim 12, further comprising an oxide material having a thickness of from about 50 Å to about 100 Å on the opposing regions of the semiconductor material.

16. The semiconductor device structure of claim 12, wherein the source and the drain comprise the conductivity dopants and the stress inducing elements.

17. The semiconductor device structure of claim 12, further comprising the stress inducing elements in the opposing regions of the semiconductor material.

18. The semiconductor device structure of claim 12, wherein a depth of the conductivity dopants is greater than a depth of the stress inducing elements.

19. A semiconductor device structure, comprising:
a semiconductor material confined within trenches in regions of a substrate laterally adjacent opposing sides of a transistor gate;
nanocavities within at least a portion of the area occupied by the semiconductor material; and
extensions of a source region and a drain region within the substrate, the extensions of the source region and the drain region laterally adjacent a strained transistor channel and comprising conductivity dopants and stress inducing elements.

20. The semiconductor device structure of claim 19, further comprising the stress inducing elements within the semiconductor material, a depth of the conductivity elements from a surface of the substrate greater than a depth of the stress inducing elements from the surface of the substrate.

* * * * *